United States Patent
Sato

(10) Patent No.: US 8,435,353 B2
(45) Date of Patent: May 7, 2013

(54) THIN FILM FORMING APPARATUS AND METHOD

(75) Inventor: Nobuyoshi Sato, Mie (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 103 days.

(21) Appl. No.: 13/157,772

(22) Filed: Jun. 10, 2011

(65) Prior Publication Data

US 2011/0306217 A1 Dec. 15, 2011

(30) Foreign Application Priority Data

Jun. 11, 2010 (JP) .................................. 2010-134297

(51) Int. Cl.
*C23C 16/00* (2006.01)

(52) U.S. Cl.
USPC .... 118/726; 118/238; 118/728; 257/E21.214; 438/758

(58) Field of Classification Search .................... None
See application file for complete search history.

(56) References Cited

U.S. PATENT DOCUMENTS

| 5,316,472 A * | 5/1994 | Niino et al. ................... 432/241 |
| 6,344,387 B1 * | 2/2002 | Hasebe et al. ................ 438/240 |
| 2003/0150386 A1 * | 8/2003 | Shimada ....................... 118/728 |

FOREIGN PATENT DOCUMENTS

| JP | 2-106921 | 4/1990 |
| JP | 6-310443 | 11/1994 |
| JP | 7-45532 | 2/1995 |
| JP | 2003-218101 | 7/2003 |
| JP | 2008-124091 | 5/2008 |
| JP | 2009-81258 | 4/2009 |

* cited by examiner

*Primary Examiner* — Julio J Maldonado
*Assistant Examiner* — Yasser Abdelaziez
(74) *Attorney, Agent, or Firm* — Oblon, Spivak, McClelland, Maier & Neustadt, L.L.P.

(57) ABSTRACT

According to one embodiment, the thin film forming apparatus includes a boat capable of holding two wafers, in each of which a cutout portion is provided in an outer peripheral edge portion, in a groove portion for holding a wafer in a state where back surfaces face each other. Moreover, the thin film forming apparatus includes a reactor that accommodates the boat and form a coating on each of surfaces of the two wafers by a vapor deposition reaction. The positions in the groove portion, at which the two wafers are held, respectively, are displaced in a direction parallel to the surfaces of the wafers.

13 Claims, 9 Drawing Sheets

THIN FILM FORMING APPARATUS AND METHOD

CROSS-REFERENCE TO RELATED APPLICATIONS

This application is based upon and claims the benefit of priority from Japanese Patent Application No. 2010-134297, filed on Jun. 11, 2010; the entire contents of which are incorporated herein by reference.

FIELD

Embodiments described herein relate generally to a thin film forming apparatus and a method.

BACKGROUND

In a manufacturing process of semiconductor devices, for example, a film formation is performed on a semiconductor wafer by using an apparatus that performs a film forming process by a chemical reaction such as a low-pressure CVD (Chemical Vapor Deposition) apparatus. In the low-pressure CVD apparatus, a chemical reaction is induced in the gas phase under reduced pressure by applying a reaction energy, such as heat and plasma, to a source gas introduced into a reaction container and this reaction product is deposited on the surface of the semiconductor wafer thereby forming a thin film.

In such a low-pressure CVD apparatus, a batch-type vertical CVD apparatus capable of processing a plurality of wafers at a time is widely used in terms of high productivity. In the batch-type vertical CVD apparatus, a plurality of wafers is accommodated in a boat, which is a wafer holding unit, in multiple stages in a vertical direction with predetermined intervals. Then, the film forming process is performed in a state where the boat is introduced in the apparatus.

Moreover, for further improving the productivity, it is considered to accommodate two wafers in the boat in a state of being superimposed and held with the back surfaces thereof being in contact with each other and perform the film formation. However, for realizing such a film formation, there is a problem in accommodation of wafers in the boat and carrying-out of the wafers from the boat. Specifically, it is difficult by the present technology to superimpose two wafers without generating scratches and cracks on the wafers. Similarly, stripping and carrying-out of two superimposed wafers from the boat is also difficult by the present technology.

Therefore, a technology capable of realizing an efficient film forming process is desired in a thin film forming apparatus and a thin film forming method.

DETAILED DESCRIPTION

Figure 1:
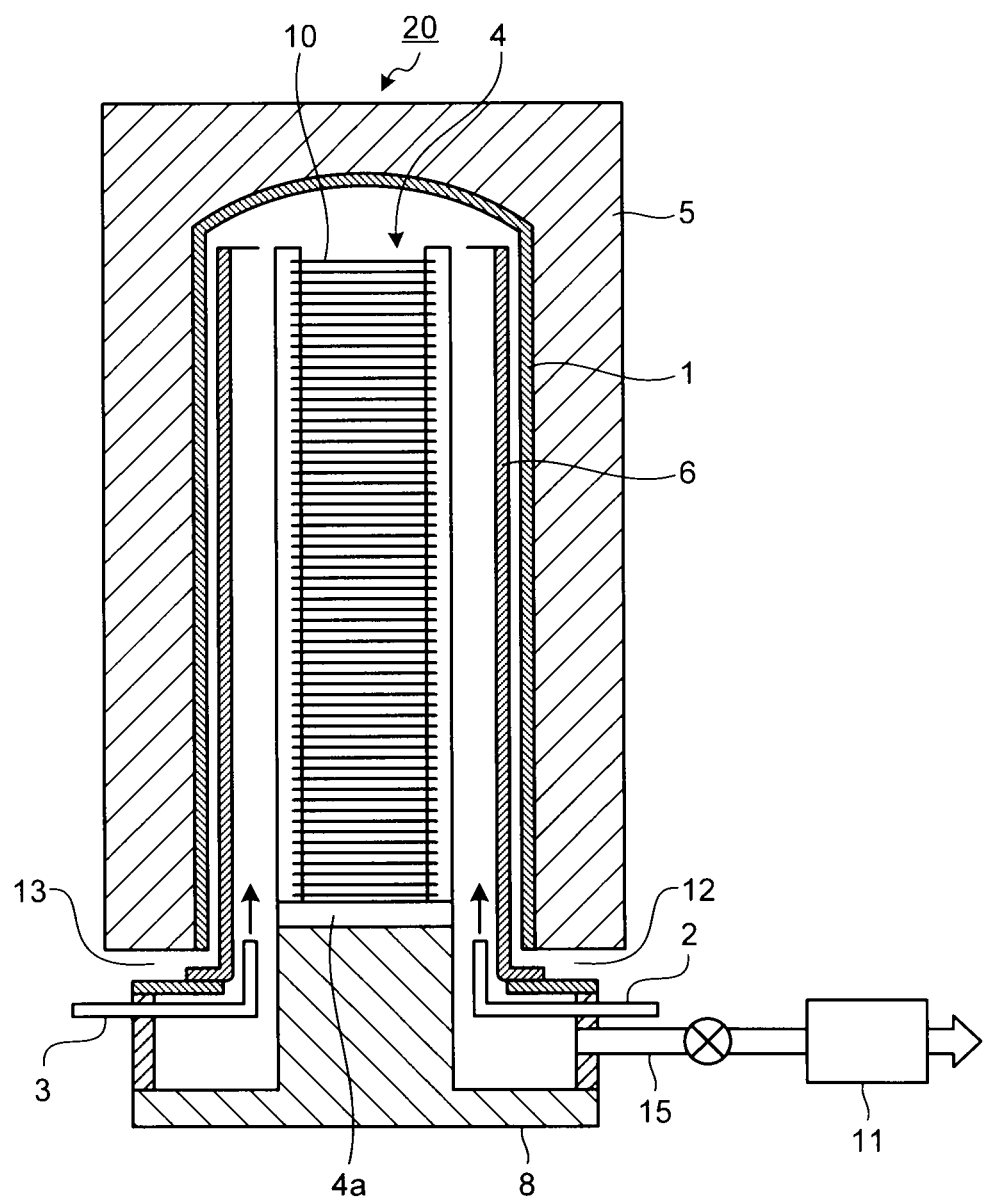
FIG. 1 is a schematic diagram illustrating a configuration of a batch-type low-pressure vertical CVD apparatus according to an embodiment.

According to an embodiment, the thin film forming apparatus includes a boat capable of holding two wafers, in each of which a cutout portion is provided in an outer peripheral edge portion, in a groove portion for holding a wafer in a state where back surfaces face each other. Moreover, the thin film forming apparatus includes a reactor that accommodates the boat and form a coating on each of surfaces of the two wafers by a vapor deposition reaction. The positions in the groove portion, at which the two wafers are held, respectively, are displaced in a direction parallel to the surfaces of the wafers.

The embodiment of a thin film forming apparatus and a method will be explained below in detail based on the drawings. The present invention is not limited to the following description and can be appropriately modified within a range without departing from the scope of the present invention. In the drawings illustrated below, the scale of each member is different from a realistic one in some cases for easy understanding. The same thing can be said between the drawings.

FIG. 1 is a schematic diagram illustrating a configuration of a batch-type low-pressure vertical CVD apparatus 20 (hereinafter, simply, CVD apparatus) according to the embodiment. The CVD apparatus 20 shown in FIG. 1 includes a double structure reactor including an outer tube 1 and an inner tube 6, and includes a boat 4, which accommodates semiconductor wafers 10 (hereinafter, simply wafers 10) that are wafers being processed, on the inner side of the inner tube 6. As the wafer 10, for example, a silicon wafer is used. The boat 4 is formed of a material such as a quartz, silicon, and silicon carbide.

A nozzle 2 and a nozzle 3, from which a reaction gas is introduced, are arranged to extend from near the bottom portion of the inner tube 6 into the inner tube 6. The reaction gas passes through the inside of the nozzle 2 and the nozzle 3 and is introduced into the inner tube 6. Used reaction gas passes through the region sandwiched by the inner tube 6 and the outer tube 1 and is discharged from an exhaust opening 12 and an exhaust opening 13 provided in the lower portion of the apparatus. Heating of the wafer 10 is performed by a heater 5 provided around the reactor. Moreover, a vacuum pump 11 is connected to a pressure relief opening 15 provided in the bottom portion of the CVD apparatus 20, whereby the air pressure in the reactor is adjusted.

Figure 2A:
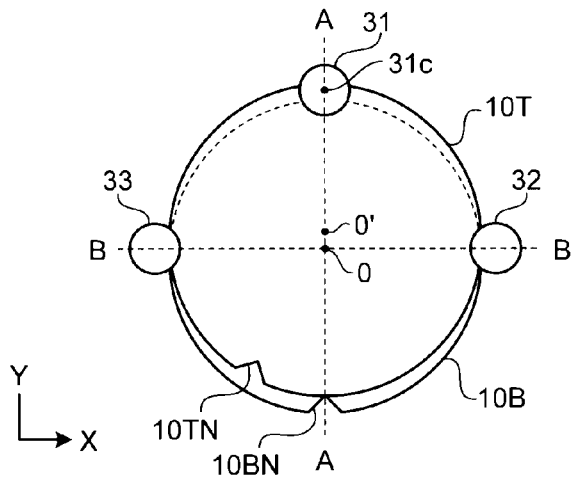
FIG. 2A to FIG. 2C are diagrams schematically illustrating a holding method of wafers in a boat according to the embodiment.
Figure 2B:
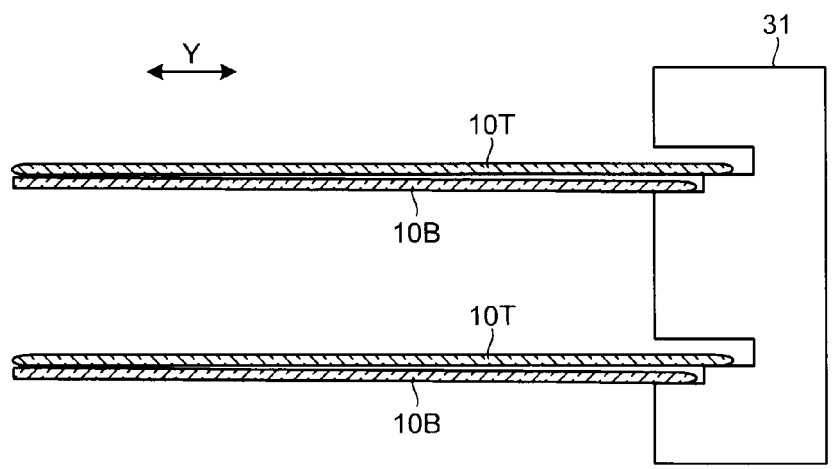
Figure 2C:
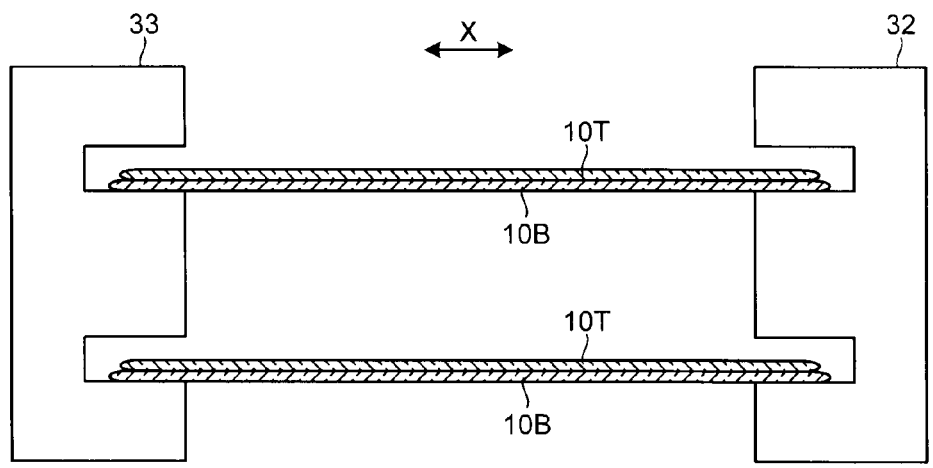

FIG. 2A to FIG. 2C are diagrams schematically illustrating a holding method of the wafers 10 in the boat 4. FIG. 2A is a plan view illustrating the holding method of the wafers 10 in the boat 4. FIG. 2B is a cross-sectional view illustrating the holding method of the wafers 10 in the boat 4 and illustrates an A-A cross section in FIG. 2A. FIG. 2C is a cross-sectional view illustrating the holding method of the wafers 10 in the boat 4 and illustrates a B-B cross section in FIG. 2A.

The boat 4 includes a column 31, a column 32, and a column 33 as a plurality of upstanding columns forming the boat 4 as shown in FIG. 2A, and is formed so that a plurality of the wafers 10 having a diameter of, for example, 300 mm, is placed and held. These columns are arranged at equal intervals along a half circumference of a circle having a diameter slightly larger than the diameter of the wafer 10. In the present embodiment, the column 32 and the column 33 are arranged to face each other in the radial direction of the circle, and the column 31 is arranged at a middle position between the column 32 and the column 33 on the half circumference of the circle. Moreover, the column 31 is arranged slightly outside the half circumference of the circle. The column 31, the column 32, and the column 33 are each fixed to a bottom plate 4a. The positional relationship between the column 31, the column 32, and the column 33 has no problem in transport of the wafer 10 in the principle of the present embodiment and it is sufficient that the column 31, the column 32, and the column 33 are positioned to surely hold the wafers 10.

On the side surfaces of the column 31, the column 32, and the column 33 on the side of holding the wafers 10, groove portions for holding the wafers 10 are arranged at the same height. In the groove portion, two wafers 10 of the same size are held in a superimposed state so that the back surfaces face each other. Specifically, as shown in FIG. 2B and FIG. 2C, in one groove portion, an upper side top wafer 10T and a lower side bottom wafer 10B are held in a superimposed state so that the back surfaces face each other. The interval between the back surfaces of the top wafer 10T and the bottom wafer 10B at this time is about 0 to a few mm. The back surface of the wafer 10 is a surface on the opposite side of the device surface of the wafer 10 and is a surface on which the film formation is not needed.

Moreover, in the groove portions adjacent in the vertical direction, the top wafer 10T held on the upper side in the lower groove portion and the bottom wafer 10B held on the lower side in the upper groove portion are accommodated so that the front surfaces thereof face each other. The interval between the front surfaces of the top wafer 10T and the bottom wafer 10B at this time is set to a predetermined regular interval. The front surface of the wafer 10 is the device surface of the wafer 10 and is a film-forming surface on which a desired film is to be formed.

Then, a plurality of the wafers 10 is arranged in the boat 4 in such arrangement. With the above configuration, the boat 4 can accommodate twice the number of the wafers 10 compared with the case where one wafer 10 is held in one groove portion. By accommodating the wafers 10 in the boat 4 in such arrangement, in the film formation, the wafers 10 held in one groove portion are exposed to a reaction gas in a state where the back surfaces thereof are in contact with each other or there is a slight clearance between the back surfaces. Therefore, a coating can be formed on the front surfaces of the wafers 10 held in one groove portion in one film forming process by introducing the boat 4 into the reactor and performing the film formation.

Two wafers 10 held in one groove portion are superimposed in a state where part of the upper side wafer 10 is protruded from the lower side wafer 10 by displacing the positions in the groove portion, at which the lower side wafer 10 and the upper side wafer 10 are held, respectively, from each other in a direction parallel to the surface of the lower side wafer 10. Then, the wafers 10 are superimposed so that part of the cutout portion of the lower side wafer 10 is partially covered by the upper side wafer 10. Specifically, the wafers 10 are superimposed in a state where the outer peripheral positions of the wafers are different in an in-plane direction by a displacement amount that is equal to or less than the length of the cutout portion in the radial direction of the wafer so that the cutout portion provided in the outer peripheral edge portion of the lower side wafer 10 is exposed and the positions of the cutout portions of the two wafers are different in a circumferential direction. Moreover, the displacement direction of the two wafers 10 is a direction in which the cutout portion of the lower side wafer is exposed. One example of the cutout portion is a notch portion provided in a wafer.

For example, as shown in FIG. 2A, the wafers 10 held in one groove portion are superimposed in a state where the outer peripheral positions are displaced in the radial direction, and the positions of the notch portions that are the cutout portions provided in the outer peripheral edge portions of the wafers 10 are displaced from each other in the circumferential direction. Specifically, the bottom wafer 10B held on the upper side in one groove portion and the top wafer 10T held on the lower side in the groove portion are superimposed in a state where the positions of the outer peripheral edge portions are displaced in the diametral direction of the bottom wafer 10B including a notch portion 10BN provided in the outer peripheral edge portion of the bottom wafer 10B. The displacement direction is a direction in which the notch portion 10BN of the bottom wafer 10B is exposed. Moreover, the bottom wafer 10B and the top wafer 10T are superimposed in a state where the position of the notch portion 10BN provided in the outer peripheral edge portion of the bottom wafer 10B and the position of a notch portion 10TN provided in the outer peripheral edge portion of the top wafer 10T are displaced in the circumferential direction.

In such a holding state of the wafers, a center position O of the bottom wafer 10B in the in-plane direction, a center position O' of the top wafer 10T in the in-plane direction, a center position 31c of the column 31, and the notch portion 10BN of the bottom wafer 10B are aligned along a virtual line. In other words, in the boat 4, two wafers can be held with the state where the center positions of the wafers 10 are displaced and the positions of the outer peripheries are displaced defined as normal positions.

The two wafers 10 are superimposed and held in a state where the center positions of the wafers are different in the in-plane direction and the positions of the cutout portions provided in the outer peripheral edge portions of the wafers are different in the circumferential direction in this manner, so that the wafers 10 can be accommodated in the groove portion of the boat 4 in a superimposed state without generating scratches and cracks as described later. Moreover, carrying-out of the two superimposed wafers 10 from the boat 4 and strip of the superimposed wafers 10 can be performed without generating scratches and cracks on the wafers 10.

Figure 3:
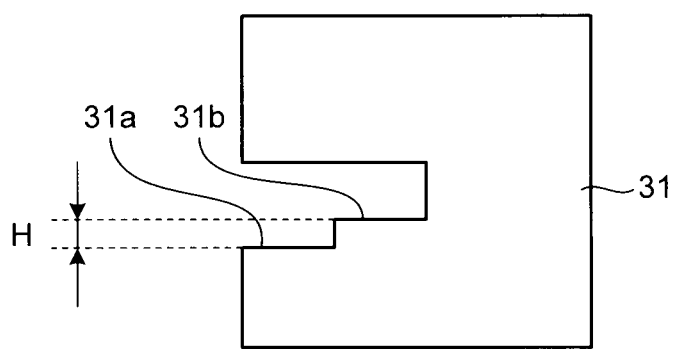
FIG. 3 is a main-portion cross-sectional view illustrating a groove portion of a column of the boat according to the embodiment.

Next, the holding method of the wafers 10 in the groove portion of the column 31 is explained. FIG. 3 is a main-portion cross-sectional view illustrating the groove portion of the column 31 of the boat 4. In the groove portion of the column 31, a step formed by a first holding surface 31a and a second holding surface 31b is provided. The first holding surface 31a holds the lower side bottom wafer 10B among the wafers 10 held in one groove portion in a superimposed state. The second holding surface 31b is provided above the first holding surface 31a and holds the upper side top wafer 10T among the wafers 10 held in one groove portion in a superimposed state. The second holding surface 31b is formed deeper in the depth direction of the groove portion than the first holding surface 31a and holds the top wafer 10T at a position deeper in the depth direction of the groove portion than the bottom wafer 10B. Specifically, the outer peripheral position of the top wafer 10T on the second holding surface 31b is a position deeper in the depth direction of the groove portion than the outer peripheral position of the bottom wafer 10B on the first holding surface 31a. A step dimension H, i.e., a gap (the difference in height) between the first holding surface 31a and the second holding surface 31b is equal to or larger than the thickness of the wafer 10. If the step dimension H is less than the thickness of the wafer 10, the second holding surface 31b cannot hold the top wafer 10T.

On the other hand, when the step dimension H is equal to the thickness of the wafer 10, the second holding surface 31b holds the top wafer 10T in a state where the back surfaces of the bottom wafer 10B and the top wafer 10T are in contact with each other. Moreover, when the step dimension H is larger than the thickness of the wafer 10, the second holding surface 31b holds the top wafer 10T in the column 31 in a state where there is a clearance between the back surface of the bottom wafer 10B and the back surface of the top wafer 10T. The step dimension H is preferably larger than the thickness of the wafer 10. There is a clearance between the back surface of the bottom wafer 10B and the back surface of the top wafer 10T, so that when removing the top wafer 10T from the boat 4, the top wafer 10T can be easily stripped from the bottom wafer 10B. The clearance between the back surfaces of the top wafer 10T and the bottom wafer 10B in this case is about a few mm. In this manner, although the back surfaces of the top wafer 10T and the bottom wafer 10B can come into contact with each other, there is preferably a slight clearance therebetween.

On the other hand, in the groove portions of the columns 32 and 33, a step structure as that of the column 31 is not formed as shown in FIG. 2C. In the groove portions in the columns 32 and 33, the top wafer 10T is superimposed on the bottom wafer 10B at approximately the same position in the in-plane direction of the wafer 10.

The shape of the columns 31, 32, and 33 is not limited to a columnar shape and can be any shape so long as the wafers 10 can be surely held. Moreover, the structure in the groove portion is also not limited to the above step structure.

Figure 4A:
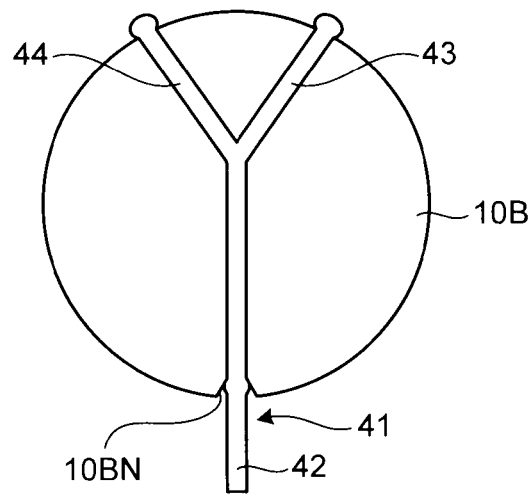
FIG. 4A to FIG. 4D are diagrams schematically illustrating a structure of a wafer holding unit according to the embodiment.
Figure 4B:
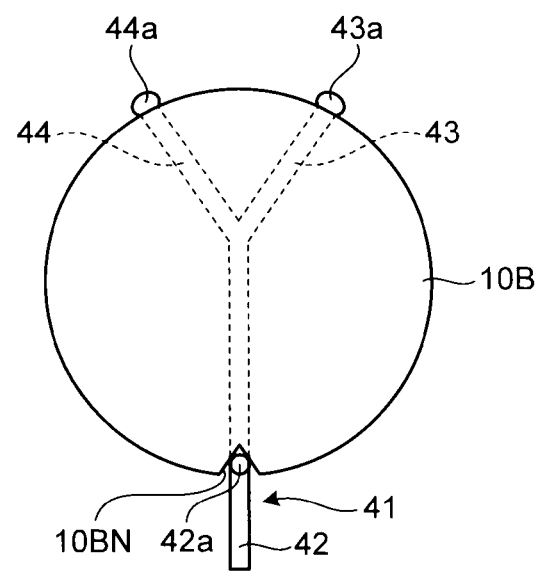
Figure 4C:
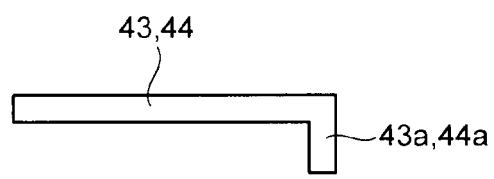
Figure 4D:
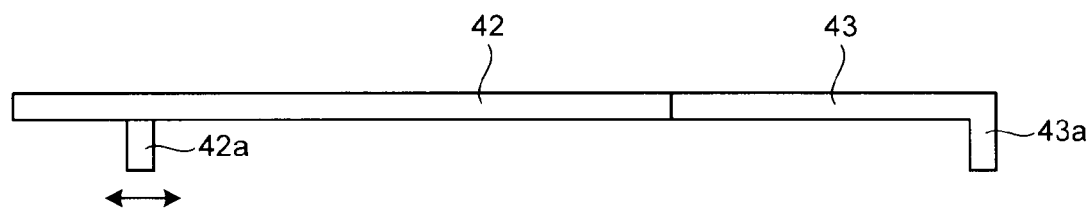

Accommodation of the wafers 10 in the boat 4 is performed, for example, by a not-shown wafer transport unit. The wafer transport unit removes the wafer 10 from a not-shown wafer cassette, in which a plurality of the wafers 10 as processing target wafers is accommodated, and transports and accommodates the wafer 10 in the boat 4. The wafer transport unit, for example, includes an approximately Y-shaped wafer holding unit 41 as shown in FIG. 4A to FIG. 4D. FIG. 4A to FIG. 4D are diagrams schematically illustrating the structure of the wafer holding unit 41, in which FIG. 4A is a diagram of the wafer holding unit 41 holding the bottom wafer 10B as viewed from the upper side (the wafer holding unit 41 side) and FIG. 4B is diagram of the wafer holding unit 41 holding the bottom wafer 10B as viewed from the lower side (the bottom wafer 10B side). FIG. 4C is a side view of a second arm portion of the wafer holding unit 41 and FIG. 4D is a side view of the wafer holding unit 41.

The wafer holding unit 41 includes a first arm portion 42, and a second arm portion 43 and a third arm portion 44 that are branched from one end of the first arm portion 42 and extend in the same plane as the first arm portion 42 as shown in FIG. 4A to FIG. 4D. The first arm portion 42 includes a movable chuck 42a, which is movable in a longitudinal direction of the first arm portion 42, on the lower surface side on which the wafer 10 is held. The second arm portion 43 includes a fixed chuck 43a at the tip. The fixed chuck 43a is fixed to the lower surface side on which the wafer 10 is held. The third arm portion 44 includes a fixed chuck 44a at the tip. The fixed chuck 44a is fixed to the lower surface side on which the wafer 10 is held. The inner side surfaces of the two fixed chucks 43a and 44a and the movable chuck 42a are pressed against the outer peripheral edge portion of the wafer 10 to hold the wafer 10 by gripping the wafer 10 by three chucks.

Next, the method of the film forming process by the CVD apparatus 20 is explained. First, the wafers 10 before subjected to the film forming process are removed from the wafer cassette and are accommodated in the boat 4. In the boat 4, for example, about 100 to 150 wafers 10 are accommodated at equal intervals while superimposing every two wafers in a state where the back surfaces thereof face each other.

Figure 5A:
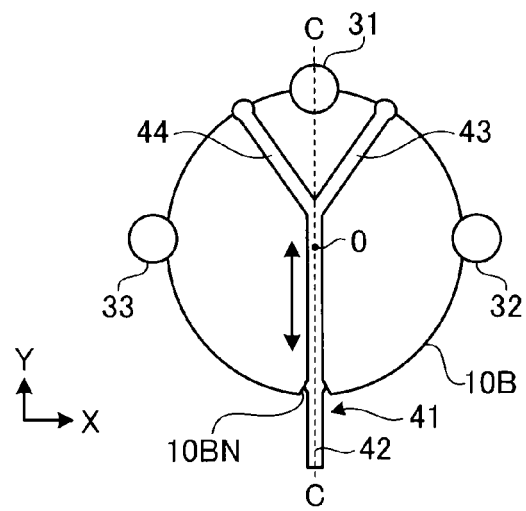
FIG. 5A to FIG. 5C are plan views schematically explaining an accommodating method of wafers in the groove portion of the boat according to the embodiment.
Figure 5B:
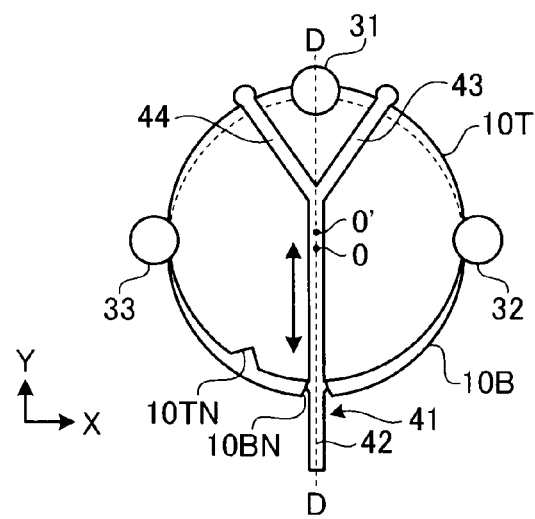
Figure 5C:
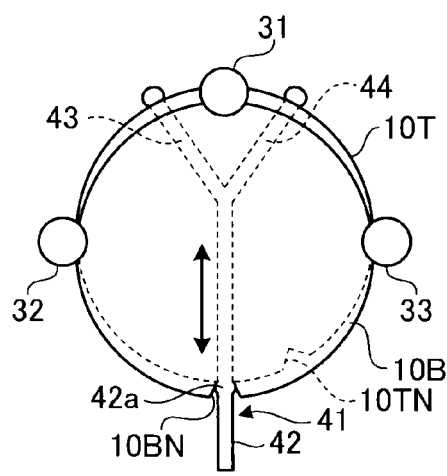
Figure 6A:
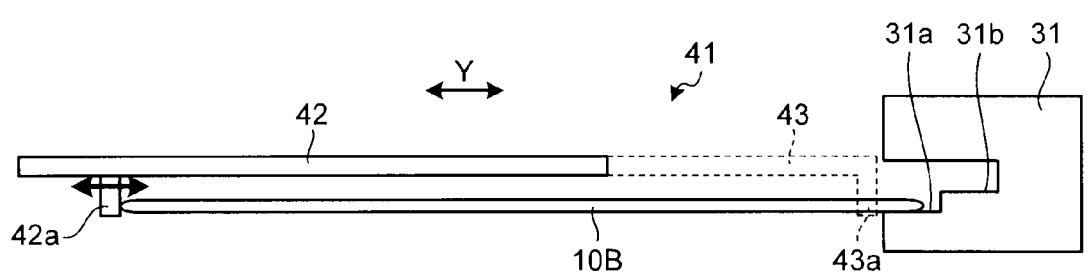
FIG. 6A and FIG. 6B are cross-sectional views schematically explaining the accommodating method of wafers in the groove portion of the boat according to the embodiment.
Figure 6B:
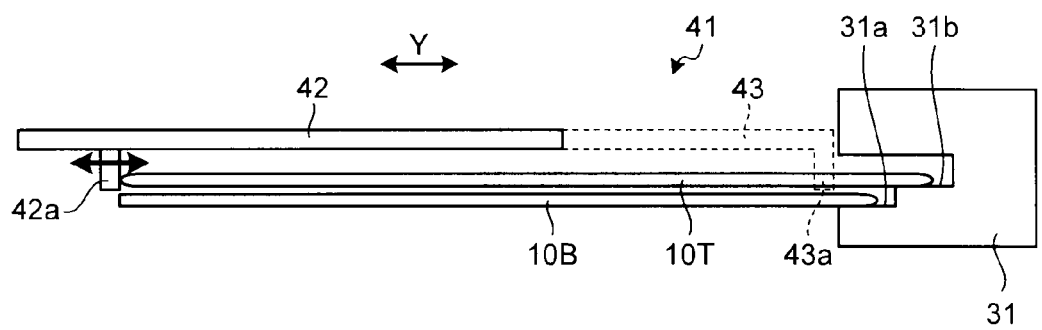
Figure 7A:
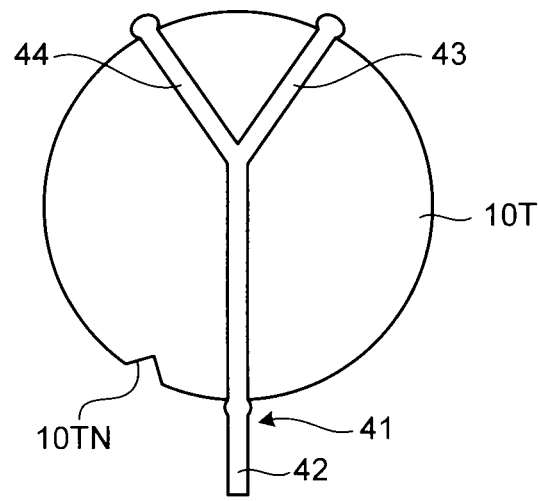
FIG. 7A and FIG. 7B are schematic diagrams schematically explaining a holding method of a top wafer by the wafer holding unit according to the embodiment.
Figure 7B:
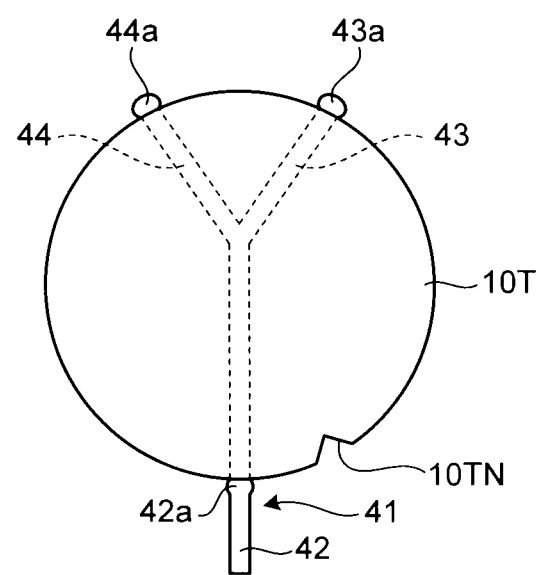

The method of accommodating the wafers 10 before subjected to the film forming process is explained with reference to FIG. 5A to FIG. 7B. FIG. 5A to FIG. 5C are schematic diagrams explaining the accommodating method of the wafers 10 in the groove portion of the boat 4. FIG. 5A is a diagram explaining the accommodating method of the bottom wafer 10B. FIG. 5B is a diagram explaining the accommodating method of the top wafer 10T and is a diagram of the top wafer 10T held by the wafer holding unit 41 as viewed from the upper side (the wafer holding unit 41 side). FIG. 5C is a plan view schematically explaining the accommodating method of the top wafer 10T and is a diagram of the top wafer 10T held by the wafer holding unit 41 as viewed from the lower side (the top wafer 10T side). FIG. 6A and FIG. 6B are cross-sectional views schematically explaining the accommodating method of the wafers 10 in the groove portion of the boat 4, in which FIG. 6A is a diagram explaining the accommodating method of the bottom wafer 10B and FIG. 6B is a diagram explaining the accommodating method of the top wafer 10T. FIG. 6A illustrates a C-C cross section in FIG. 5A. FIG. 6B illustrates a D-D cross section in FIG. 5A. In FIG. 6A and FIG. 6B, the second arm portion 43 and the fixed chuck 43a are illustrated in an overlapping manner. FIG. 7A and FIG. 7B are plan views schematically explaining the holding method of the top wafer 10T by the wafer holding unit 41, in which FIG. 7A is a diagram of the top wafer 10T held by the wafer holding unit 41 as viewed from the upper side (the wafer holding unit 41 side) and FIG. 7B a diagram of the top wafer 10T held by the wafer holding unit 41 as viewed from the lower side (the top wafer 10T side).

First, the wafer transport unit accesses the wafer cassette and holds the bottom wafer 10B before subjected to the film forming process by the wafer holding unit 41 in a state where the front surface faces downward. When holding the bottom wafer 10B by the wafer holding unit 41, the first arm portion 42 is aligned with the position of the notch portion 10BN of the bottom wafer 10B and the wafer holding surfaces of the fixed chucks 43a and 44a are brought into contact with the outer peripheral portion of the bottom wafer 10B in a state where the movable chuck 42a is opened outward. The outward is a direction away from the wafer 10 to be held.

Thereafter, the movable chuck 42a is closed inward, so that the wafer holding surface of the movable chuck 42a is pressed into the notch portion 10BN to be fixed and pressed, thereby gripping the bottom wafer 10B by the three chucks. The outward is a direction away from the wafer 10 to be held. The inward is a center direction of the wafer 10 to be held. Consequently, as shown in FIG. 4A and FIG. 4B, the bottom wafer 10B can be held. The bottom wafer 10B held by the wafer holding unit 41 in this manner is removed from the wafer cassette and is transported to the boat 4.

Next, the wafer transport unit inserts the bottom wafer 10B held by the wafer holding unit 41 into the groove portion of the boat 4. The bottom wafer 10B is inserted in the extending direction of the first arm portion 42 so that the notch portion 10BN of the bottom wafer 10B and the column 31 face each other with the center position O of the bottom wafer 10B therebetween as shown in FIG. 5A. At this time, the center position of the column 31, the center position O of the bottom wafer 10B in the in-plane direction, and the notch portion 10BN of the bottom wafer 10B are aligned along a virtual line.

As shown in FIG. 6A, after inserting the bottom wafer 10B to a predetermined holding position, the movable chuck 42a is opened outward to release the holding state of the bottom wafer 10B, whereby the bottom wafer 10B is transferred to the boat 4. At this time, in the groove portion of the column 31, the bottom wafer 10B is held on the first holding surface 31a in a state where the front surface faces downward. Moreover, in the column 32 and the column 33, the bottom wafer 10B is held on the bottom surface of the groove portion in a state where the front surface faces downward. Then, the wafer transport unit returns the wafer holding unit 41 from the boat 4.

Next, the wafer transport unit accesses the wafer cassette again and holds the top wafer 10T before subjected to the film forming process by the wafer holding unit 41 to cover the front surface by the arm portions of the wafer holding unit 41 in a state where the back surface is open, that is, the front surface faces upward. At this time, the wafer holding unit 41 grips the outer periphery of the top wafer 10T other than the notch portion 10TN.

When holding the top wafer 10T by the wafer holding unit 41, the wafer holding surfaces of the fixed chucks 43a and 44a are brought into contact with the outer peripheral portion of the top wafer 10T in a state where the positions of the fixed chucks 43a and 44a and the movable chuck 42a are set different from the position of the notch portion 10TN of the top wafer 10T in the circumferential direction and the movable chuck 42a is opened outward. Thereafter, the movable chuck 42a is closed inward, so that the wafer holding surface of the movable chuck 42a is brought into contact with the outer peripheral portion of the top wafer 10T to be fixed and pressed, thereby gripping the top wafer 10T by the three chucks. Consequently, as shown in FIG. 7A and FIG. 7B, the top wafer 10T can be held. The top wafer 10T held by the wafer holding unit 41 in this manner is removed from the wafer cassette and is transported to the boat 4.

Next, the top wafer 10T held by the wafer holding unit 41 is inserted into the groove portion in which the bottom wafer 10B is accommodated first in the boat 4. At this time, the positions in the groove portion, at which the bottom wafer 10B and the top wafer 10T are held, respectively, are displaced from each other in a direction parallel to the surface of the wafer 10 to cause part of the top wafer 10T to protrude from the bottom wafer 10B. Then, the top wafer 10T is inserted into the groove portion with the front surface facing upward in a state where one of the holding positions of the top wafer 10T is aligned with the notch portion 10BN of the bottom wafer 10B so that part of the notch portion 10BN of the bottom wafer 10B is partially covered by the top wafer 10T. For example, the top wafer 10T is inserted in the extending direction of the first arm portion 42 by inserting the movable chuck 42a into the notch portion 10BN of the bottom wafer 10B so that the notch portion 10BN of the bottom wafer 10B and the column 31 face each other with the center position O' of the top wafer 10T therebetween as shown in FIG. 5B. At this time, the center position of the column 31, the center position O' of the top wafer 10T in the in-plane direction, the center position O of the bottom wafer 10B in the in-plane direction, and the notch portion 10BN of the bottom wafer 10B are aligned along a virtual line.

As shown in FIG. 6B, after inserting the top wafer 10T to a predetermined holding position, the movable chuck 42a is opened outward to release the holding state of the top wafer 10T, whereby the top wafer 10T is transferred to the boat 4. At this time, in the groove portion of the column 31, the top wafer 10T is held on the second holding surface 31b in a state where the front surface faces upward. Moreover, in the column 32 and the column 33, the top wafer 10T is held on the bottom wafer 10B in a state where the front surface faces upward. As described above, the outer peripheral positions of the bottom wafer 10B and the top wafer 10T can be displaced from each other by inserting the movable chuck 42a into the notch portion 10BN of the bottom wafer 10B, whereby the notch portion 10BN of the bottom wafer 10B is exposed. Thereafter, the wafer transport unit returns the wafer holding unit 41 from the boat 4.

These series of transferring operations are repeated, so that the bottom wafer 10B and the top wafer 10T are superimposed and accommodated in one groove portion of the boat 4 with the back surfaces facing each other in a state where the center positions O and O' of the wafers 10 are different in the in-plane direction and the positions of the notch portions 10BN and 10TN provided in the outer peripheral edge portions of the wafers are different in the circumferential direction. Accommodation of the wafers 10 in the boat 4 described above is performed under ordinary pressure. When accommodating the wafers 10 in the boat 4, it is applicable to accommodate the bottom wafer 10B and the top wafer 10T in order in each groove portion as described above or accommodate the top wafer 10T in each groove portion after accommodating all of the bottom wafers 10B in the groove portions first.

Moreover, the bottom wafer 10B and the top wafer 10T can be accommodated in one wafer cassette, or can be accommodated in individual wafer cassettes, respectively.

Furthermore, the positions of the notch portions 10N in the bottom wafer 10B and the top wafer 10T are aligned, for example, according to a predetermined rule at the time when the wafers are accommodated in the wafer cassette. For example, the bottom wafers 10B are accommodated in the wafer cassette with the positions of the notch portions 10N aligned on the near side and the top wafers 10T are accommodated in the wafer cassette in a state where the positions of the notch portions 10N are slightly displaced from the near side in the circumferential direction. The near side is a side from which the wafer holding unit 41 removes the wafer 10 from the wafer cassette. Consequently, the wafer 10 removed from the wafer cassette can be accommodated in the boat 4 without changing the position of the notch.

Moreover, the positions of the notch portions 10N in the bottom wafer 10B and the top wafer 10T can be adjusted before accommodating the wafer 10 in the boat after removing the wafer 10 from the wafer cassette. Specifically, the wafer transport unit can include an adjustment mechanism that adjusts the position of the notch portion 10N in the wafer 10 after holding the wafer 10 by the wafer holding unit 41.

The boat 4 in which the wafers 10 are accommodated is introduced into the reactor in a state of being placed on a flange 8. After introducing the boat 4, the heater 5 heats the inside of the reactor and the vacuum pump 11 creates a high vacuum condition in the reactor, whereby the temperature and the pressure in the reactor are controlled. Thereafter, a source gas is introduced into the reactor from the nozzle 2 and the nozzle 3, so that a chemical reaction of the source gas occurs in the reactor and a thin film is deposited onto the surface of the wafer 10 to perform the film formation. The wafers 10 are accommodated in the boat 4 while superimposing every two wafers in a state where the back surfaces face each other, so that the film formation is performed only on the front surfaces of the wafers 10 and is not performed on the back surfaces. After the film formation, the boat 4 is removed from the reactor and the wafers 10 subjected to the film forming process are transported from the boat 4 to the wafer cassette to be accommodated therein.

When carrying out the wafers 10 subjected to the film forming process from the boat 4 to the wafer cassette, the operation is performed by the procedure reverse to that of the transferring operation to the boat 4 described above. First, the top wafer 10T subjected to the film forming process is transferred from the boat 4 to the wafer cassette. The wafer transport unit accesses the groove portion of the boat 4 and holds the top wafer 10T whose front surface faces upward among the two superimposed wafers 10 by the wafer holding unit 41. At this time, the top wafer 10T is held by gripping the outer peripheral portion overlapping the region corresponding to the notch portion 10BN of the bottom wafer 10B and the outer peripheral portion of the region protruding from the bottom wafer 10B of the top wafer 10T. The outer peripheral position of the top wafer 10T is displaced on the column 31 side from the outer peripheral position of the bottom wafer 10B and the movable chuck 42a can be inserted into the notch portion 10BN of the bottom wafer 10B, so that the wafer holding unit 41 can easily grip and hold the outer peripheral portion of the top wafer 10T.

Next, the wafer transport unit removes the top wafer 10T held by the wafer holding unit 41 from the boat 4, and accesses the wafer cassette and accommodates the top wafer 10T in the wafer cassette. These series of the transferring operations are repeated.

Next, the bottom wafer 10B that is subjected to the film forming process and remains in the groove portion is transferred from the boat 4 to the wafer cassette. The wafer transport unit accesses the groove portion of the boat 4 and holds the bottom wafer 10B whose front surface faces downward by the wafer holding unit 41. The holding method of the bottom wafer 10B is similar to the case of accommodating the bottom wafer 10B before subjected to the film forming process in the boat 4.

Next, the wafer transport unit removes the bottom wafer 10B held by the wafer holding unit 41 from the boat 4, and accesses the wafer cassette and accommodates the bottom wafer 10B in the wafer cassette. These series of transferring operations are repeated, so that the wafers 10 subjected to the film forming process can be transferred from the boat 4 to the wafer cassette. Accommodation of the wafers 10 to the wafer cassette described above is performed under ordinary pressure.

When transferring the wafers 10 to the wafer cassette, it is applicable to transfer the bottom wafer 10B from the boat 4 to the wafer cassette after transferring all of the top wafers 10T from the boat 4 to the wafer cassette as described above or transfer the top wafer 10T and the bottom wafer 10B in order from each groove portion.

Figure 8:
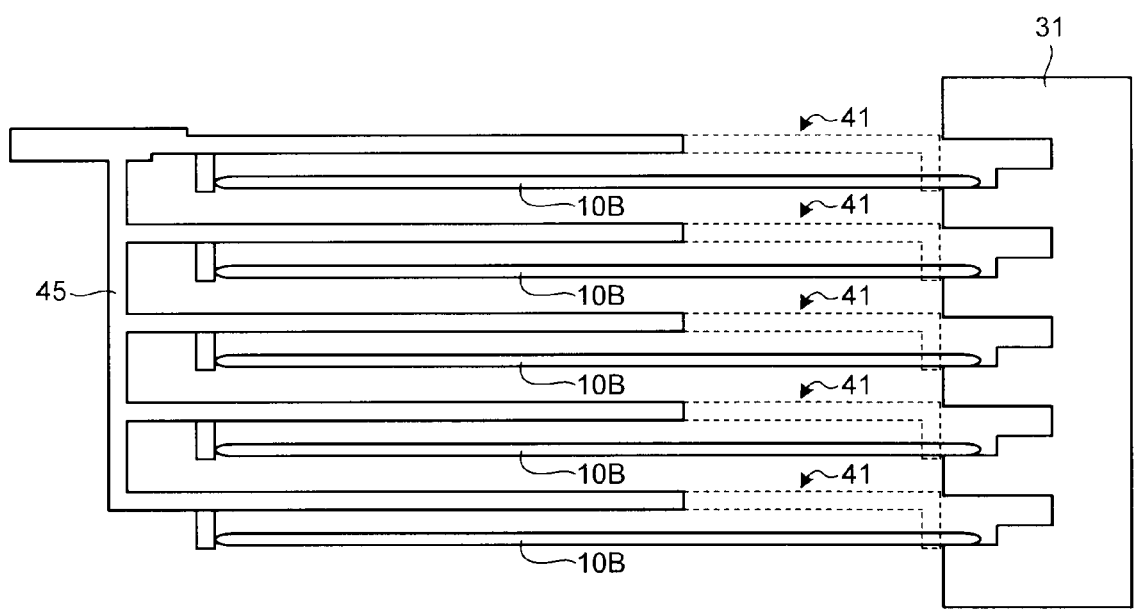
FIG. 8 is a cross-sectional view schematically illustrating an accommodating method of bottom wafers into the groove portions of the boat by five connected wafer holding units.

Moreover, in the above description, explanation is given for the case where the wafer transport unit includes one wafer holding unit 41, however, a plurality of connected wafer holding units 41 can be used. In this case, a plurality of the wafers 10 can be transferred from the wafer cassette to the boat 4 and from the boat 4 to the wafer cassette in one transferring process. FIG. 8 is a cross-sectional view schematically illustrating the accommodating method of the bottom wafers 10B in the groove portions of the boat 4 by five wafer holding units 41 connected by a connecting unit 45.

For enabling the transferring method of the wafers as described above, the column is formed such that the second and third arm portions 43 and 44 can enter when inserting the wafer 10 into the groove portion.

In the above CVD apparatus 20 according to the above embodiment, the film formation can be performed in a state where the wafers are superimposed so that the back surfaces face each other and held in the groove portion of the boat 4. Consequently, in the CVD apparatus 20, the film formation can be performed on twice the number of the wafers 10 in one film forming process compared with the case of holding one wafer 10 in one groove portion, whereby the film forming process with high productivity can be realized. Moreover, because the film forming process can be performed on twice the number of the wafers 10 by a reaction gas for one film forming process compared with the case of holding one wafer 10 in one groove portion, the film forming process at low cost can be realized.

Moreover, in the CVD apparatus 20, when the wafers 10 are held in one groove portion of the boat 4, the outer peripheral positions of the wafers 10 overlap in such a manner that part of the notch portion 10N of the lower side wafer 10 is exposed and part thereof is hidden. The displacement direction and the displacement amount of the two wafers 10 can be any direction and any amount so long as such positional relationship is satisfied.

Consequently, it is possible to suppress that, when superimposing the top wafer 10T on the bottom wafer 10B, the arm portion of the wafer holding unit 41 comes into contact with the bottom wafer 10B and scratches the bottom wafer 10B. Moreover, when carrying out the superimposed wafers 10 from the boat 4, the arm portion of the wafer holding unit 41 can surely grip and hold the top wafer 10T without coming into contact with the bottom wafer 10B. In other words, the wafers 10 can be superimposed and held in the boat 4 without generating scratches and cracks due to contact of the arm portion with the wafer 10, and moreover can be stripped to be carried out.

Therefore, according to the CVD apparatus 20 in the present embodiment, scratches and cracks of the wafer 10 in the transport can be prevented, the film formation can be realized in a state where two wafers are superimposed and held so that the back surfaces face each other, and the film formation with high productivity and low cost can be realized.

In the above embodiment, the batch-type low-pressure vertical CVD apparatus is explained, however, the above described boat can be widely applied to vertical CVD apparatuses excluding a CVD apparatus that uses parallel-plate-type counter electrodes. Moreover, the above boat can be applied to a single wafer type in which wafers are processed one by one.

Moreover, in the above embodiment, explanation is given for the case of holding wafers in a superimposed state in one groove, however, wafers can be held in the positional relationship similar to the above in the groove portions adjacent in the vertical direction of the boat 4.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A thin film forming apparatus comprising:
a boat capable of holding two wafers, in each of which a cutout portion is provided in an outer peripheral edge portion, in a groove portion for holding a wafer in a state where back surfaces face each other; and
a reactor that accommodates the boat and form a coating on each of surfaces of the two wafers by a vapor deposition reaction, wherein
positions in the groove portion, at which the two wafers are held, respectively, are displaced in a direction parallel to the surfaces of the wafers.

2. The thin film forming apparatus according to claim 1, wherein
the groove portion partially includes
a first holding surface, on which a first wafer to be held on a lower side among the two wafers is held, and
a second holding surface, which is formed deeper in a depth direction of the groove portion than the first holding surface above the first holding surface and on which a second wafer to be held on an upper side among the two wafers is held.

3. The thin film forming apparatus according to claim 2, wherein the second wafer is held on the second holding surface so that part of the cutout portion of the first wafer is partially covered by the second wafer.

4. The thin film forming apparatus according to claim 3, further comprising a wafer transport unit that carries out the second wafer held on the second holding surface from the boat in a state of holding the second wafer by a wafer holding unit that holds the second wafer by gripping three points of an outer peripheral portion of the second wafer, wherein
a first point among the three points is an outer peripheral portion that overlaps a region corresponding to the cutout portion of the first wafer in the second wafer, and
a second point and a third point among the three points is an outer peripheral portion of a region protruding from the first wafer in the second wafer.

5. The thin film forming apparatus according to claim 4, wherein the wafer transport unit includes a plurality of wafer holding units in a thickness direction of the second wafer held by the wafer holding unit.

6. The thin film forming apparatus according to claim 4, wherein
the wafer holding unit includes
a first arm portion that includes a movable chuck that grips the first point of the outer peripheral portion of the second wafer, and
a second arm portion and a third arm portion that extend branching from one end of the first arm portion, and include fixed chucks that grip the second point and the third point of the outer peripheral portion of the second wafer, respectively.

7. The thin film forming apparatus according to claim 2, wherein a gap between the first holding surface and the second holding surface is setup at position in a depth direction of the groove portion.

8. The thin film forming apparatus according to claim 2, wherein
the boat includes a plurality of groove portions, which hold outer peripheral edge portions of the wafers, respectively, separately at a same height, and
one of the groove portions includes the first holding surface and the second holding surface.

9. The thin film forming apparatus according to claim 2, further comprising an adjustment mechanism that adjusts so that the cutout portions of the two wafers do not overlap each other.

10. The thin film forming apparatus according to claim 1, wherein the groove portion includes a holding portion that holds the two wafers so that the back surfaces of the two wafers come into contact with each other.

11. The thin film forming apparatus according to claim 1, wherein the two wafers are held in one groove portion.

12. The thin film forming apparatus according to claim 1, wherein the boat includes a plurality of groove portions in a thickness direction of the wafers held in the groove portion.

13. The thin film forming apparatus according to claim 1, wherein the thin film forming apparatus is a batch-type low-pressure vertical CVD apparatus.

* * * * *